(12) United States Patent
Turner et al.

(10) Patent No.: US 9,935,584 B1
(45) Date of Patent: Apr. 3, 2018

(54) SELF-BIASED GYRATOR-BASED RECEIVER FOR AMPLIFICATION AND EQUALIZATION OF SINGLE-ENDED SIGNALS

(71) Applicant: NVIDIA Corporation, Santa Clara, CA (US)

(72) Inventors: Walker Joseph Turner, Durham, NC (US); John W. Poulton, Chapel Hill, NC (US); Wenxu Zhao, Raleigh, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 15/474,912

(22) Filed: Mar. 30, 2017

(51) Int. Cl.
| H03F 1/02 | (2006.01) |
| H03F 3/195 | (2006.01) |
| H04B 1/12 | (2006.01) |

(52) U.S. Cl.
CPC ........... *H03F 1/0205* (2013.01); *H03F 3/195* (2013.01); *H03F 2200/144* (2013.01); *H04B 1/12* (2013.01)

(58) Field of Classification Search
CPC .......... H03F 1/0205; H03F 1/189; H03F 1/19; H03F 1/195
USPC ........................................ 326/30, 82–83, 86
See application file for complete search history.

(56) References Cited

U.S. PATENT DOCUMENTS

| | | | |
|---|---|---|---|
| 3,725,822 A | 4/1973 | Eaton, Jr. | |
| 3,898,578 A * | 8/1975 | Fletcher | H03F 3/3077 330/253 |
| 5,757,242 A | 5/1998 | Chow et al. | |
| 6,426,680 B1 | 7/2002 | Duncan et al. | |
| 7,342,419 B2 * | 3/2008 | Huang | H03K 19/018592 326/30 |
| 7,391,829 B2 * | 6/2008 | Tripathi | H03H 21/0001 330/254 |
| 7,443,232 B2 | 10/2008 | Bladh | |
| 7,812,667 B2 | 10/2010 | Fagg | |
| 8,149,955 B2 | 4/2012 | Tired | |
| 8,513,997 B2 | 8/2013 | Hesen et al. | |
| 8,514,021 B2 | 8/2013 | Heikkinen et al. | |
| 8,891,704 B2 | 11/2014 | McLeod et al. | |
| 9,077,289 B2 | 7/2015 | Huang et al. | |
| 9,237,055 B2 | 1/2016 | Lin et al. | |
| 9,438,188 B2 | 9/2016 | Li et al. | |
| 2008/0126458 A1 | 5/2008 | Shin | |

(Continued)

OTHER PUBLICATIONS

Yuan, F., "CMOS Active Inductors," in CMOS Active Inductors and Transformers Principle, Implementation, and Applications, Springer, 2008, pp. 21-99.

(Continued)

*Primary Examiner* — Jason M Crawford
(74) *Attorney, Agent, or Firm* — Zilka-Kotab, PC

(57) ABSTRACT

A self-biased gyrator-based input receiver amplifies and equalizes single-ended signals. The input receiver implements inductive impedance useful for high-frequency peaking circuits using an active gyrator-C circuit comprising only resistive, capacitive, and transistor elements, which are easily and efficiently fabricated on a conventional integrated circuit. Transistors comprising the input receiver, along with resistive elements and capacitive elements may be implemented as digitally adjustable circuit elements, providing for adjustment of at least peak frequency, low-frequency gain, and termination impedance.

23 Claims, 18 Drawing Sheets

(56) References Cited

U.S. PATENT DOCUMENTS

2016/0173145 A1    6/2016  Forbes et al.
2016/0248378 A1*   8/2016  Zhang .................. H03F 1/0205

OTHER PUBLICATIONS

Dehlaghi et al., "A 0.3 pJ/bit 20 Gb/s/Wire Parallel Interface for Die-to-Die Communication," IEEE Journal of Solid-State Circuits, vol. 51, No. 11, 2016, pp. 2690-2701.
Liu, T.,"Adaptively Filtering Trans-Impedance Amplifier for RF Current Passive Mixers," Diss. University of Toronto, 2016, pp. 1-94.
Cho et al.. "A 0.4-5.3 GHz wideband LNA using resistive feedback topology." Numerical Electromagnetic and Multiphysics Modeling and Optimization (NEMO), 2016 IEEE MTT-S International Conference on IEEE, 2016, pp. 1-2.
Ghasemi, Omidreza, "Bandwidth Extension for Transimpedance Amplifiers," INTECH Open Access Publisher, 2011, pp. 1-19.
Huang et al., "A resistive-feedback LNA in 65nm CMOS with a gate inductor for bandwidth extension," Microelectronics Journal, vol. 46, No. 1, 2015, pp. 103-110.
Poulton et al., "A 0.54 pJ/b 20 Gb/s Ground-Referenced Single-Ended Short-Reach Serial Link in 28 nm CMOS for Advanced Packaging Applications," IEEE J. Solid-State Circuits, Dec. 2013, vol. 48, No. 12, pp. 3206-3218.

\* cited by examiner

1

SELF-BIASED GYRATOR-BASED RECEIVER FOR AMPLIFICATION AND EQUALIZATION OF SINGLE-ENDED SIGNALS

FIELD OF THE INVENTION

The present invention relates to input/output circuits, and more particularly to a self-biased gyrator-based receiver for amplification and equalization of single-ended signals.

BACKGROUND

In systems that include high-speed chip-to-chip digital transmission circuits, channel attenuation of high-frequency signal components can degrade signal integrity and result in inter-symbol interference. In multi-gigabit per second single-ended chip-to-chip transmission, signal integrity degradation can prevent reliable system operation altogether.

Selectively amplifying a frequency range (equalization or "peaking") may be used to compensate for channel attenuation and sharpen signal transition edges, thereby improving signal integrity. However, channel impedance and high-frequency attenuation components can vary depending on system design; furthermore, circuit parameters that determine receiver compensation can also vary across fabricated dies, resulting in potential mismatches between receiver compensation and actual channel properties. These combined variations can reduce effectiveness of conventional circuits with regard to compensating for channel loss. Furthermore, conventional solutions for matching receiver compensation to channel attenuation require complex tracking circuits that can consume significant power. Thus, there is a need for addressing these issues and/or other issues associated with the prior art.

SUMMARY

A first embodiment of an input receiver circuit comprises a first p-channel field-effect transistor (PFET), a first n-channel field-effect transistor (NFET), a feedback resistive element, a feedback capacitive element, and a termination resistive element. The first PFET includes a first source port, a first drain port, and a first gate port, wherein the first source port is coupled to a positive supply node, the first drain port is coupled to an intermediate output node, and the first gate port is coupled to a feedback node. The first NFET includes a second source port, a second drain port, and a second gate port, wherein the second source port is coupled to an input node, the second drain port is coupled to the intermediate output node, and the second gate port is coupled to the feedback node. Furthermore, the feedback resistive element is coupled between the feedback node and the intermediate output node, the feedback capacitive element is coupled between the feedback node and an alternating current (AC) ground node, and the termination resistive element is coupled between the input node and the negative supply rail.

A second embodiment of an input receiver circuit comprises a first p-channel field-effect transistor (PFET), a first n-channel field-effect transistor (NFET), a feedback resistive element, a feedback capacitive element, and a termination resistive element. The first PFET includes a first source port, a first drain port, and a first gate port, wherein the first source port is coupled to an input node, the first drain port is coupled to an intermediate output node, and the first gate port is coupled to a feedback node. The first NFET includes a second source port, a second drain port, and a second gate port, wherein the second source port is coupled to a negative supply node, the second drain port is coupled to the intermediate output node, and the second gate port is coupled to the feedback node. Furthermore, the feedback resistive element is coupled between the feedback node and the intermediate output node, the feedback capacitive element is coupled between the feedback node and an alternating current (AC) ground node, and the termination resistive element is coupled between the input node and the negative supply rail.

In one embodiment, the feedback resistive element is implemented as a digitally adjustable resistive element and the feedback capacitive element is implemented as a digitally adjustable capacitive element. In certain embodiments, the first PFET is implemented as a digitally adjustable PFET and the first NFET are implemented as a digitally adjustable NFET.

DETAILED DESCRIPTION

A self-biased input amplifier for receiving chip-to-chip communication signals is disclosed herein. The input amplifier provides tunable peaking to sharpen signal transition edges of incoming data signals, thereby compensating for channel loss and improving data transmission reliability. The input amplifier also provides tunable circuit parameters to overcome variation in circuit operation that can impact overall transmission reliability. Furthermore, tunable termination impedance is provided to reduce termination reflection of incoming data signals.

In one embodiment, the input amplifier is configured to receive an input signal referenced to a negative ground rail. In another embodiment, the input amplifier is configured to receive the input signal referenced to a positive supply rail. In a first alternative embodiment, the input amplifier is configured to receive the input signal referenced to a negative supply rail. In a second alternative embodiment, the input amplifier is configured to receive the input signal referenced to a positive ground rail.

The disclosed input amplifier implements inductive impedance (for high-frequency peaking) using an active gyrator-C circuit comprising only of resistive, capacitive, and transistor elements, which are easily and efficiently fabricated on an integrated circuit using conventional fabrication processes. As described herein, the resistive elements and capacitive elements can be implemented as digitally adjustable circuit elements, allowing the gyrator-C circuit (and therefore a peak frequency and peaking magnitude) to be tuned using digital control values.

More generally, in various embodiments the input amplifier is implemented using fixed or digitally adjustable p-channel field effect transistors (PFETs), fixed or digitally adjustable n-channel field effect transistors (NFETs), fixed or digitally adjustable resistive elements, fixed or digitally adjustable capacitive elements, or a combination thereof. Exemplary circuits for implementing digitally adjustable PFETs, NFETs, resistive elements, and capacitive elements are provided herein.

Chip-to-Chip Communication

Figure 1:
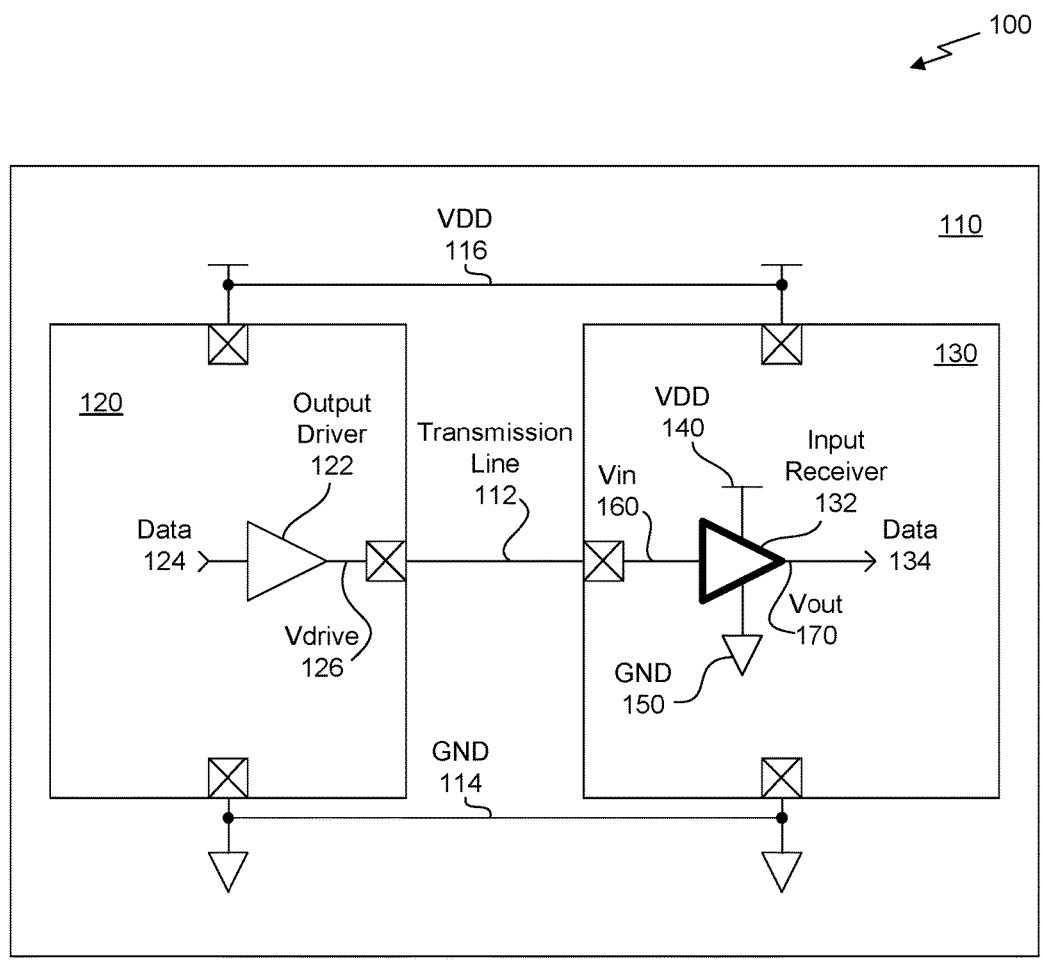
FIG. 1 illustrates a system that performs chip-to-chip communication, in accordance with one embodiment.

FIG. 1 illustrates a system 100 that performs chip-to-chip communication, in accordance with one embodiment. The system 100 includes an interconnect substrate 110, a first integrated circuit 120, a second integrated circuit 130, and a transmission line 112. In one embodiment, a supply rail VDD 116 and a ground rail GND 114 supply electrical power to the first integrated circuit 120 and the second integrated circuit 130.

An output driver 122 within the first integrated circuit 120 is configured to receive a data signal 124 as input and generate an output signal Vdrive 126. In one embodiment, the data signal 124 is generated from on-chip logic circuits within the first integrated circuit 120. The output signal Vdrive 126 is transmitted through transmission line 112 and arrives as input signal Vin 160 at the second integrated circuit 130. An input receiver 132 amplifies and equalizes the input signal 160 to generate an output signal Vout 170, which is transmitted to on-chip logic circuits within the second integrated circuit 130 as data signal 134. Input receiver 132 is powered by on-chip supply rails VDD 140 and GND 150, coupled (e.g., through an on-chip power distribution network) to supply rail VDD 116 and ground rail 114, respectively.

Ideally, data signal 134 replicates data signal 124 without error. However, transmission line 112 can introduce channel loss at certain frequencies leading to inter-symbol interference, which can corrupt data signal 134 relative to data signal 124. To compensate for loss at relevant frequencies, the input receiver 132 provides equalization or "peaking" at high frequencies, such as those high frequencies relevant to preserving signal transition edges. The peaking frequency, along with DC/low-frequency gain, can be adjusted for input receiver 132 using digital control values to compensate for channel variation in the transmission line 112 and integrated circuit fabrication process variation in the second integrated circuit 130.

In one embodiment Vdrive 126 is referenced to a voltage level for ground rail GND 114, and driven positive to represent a logical 1 or negative to represent a logical 0. For example, output driver 122 may drive Vdrive 126 to one hundred millivolts above GND 114 (+100 mV) to represent a digital 1 or drive Vdrive 126 to one hundred millivolts below GND 114 (−100 mV) to represent a digital 0. Of course, other voltage ranges and potential offsets may also be implemented without departing the scope of embodiments of the present disclosure.

In one embodiment, the interconnect substrate 110 is implemented as one of a printed circuit board, a multi-chip module interconnect, silicon interposer, and a ceramic interconnect substrate. Interconnect substrate 110 may be fabricated to include one or more interconnects, such as transmission line 112, and power distribution networks to provide networks for VDD 116 and GND 114.

In one embodiment, the system 100 is a processor complex, including one or more graphics processing unit (GPU) chips and/or one or more memory chips. For example, the first integrated circuit 120 may implement a memory chip, while the second integrated circuit 130 may implement a GPU, or vise versa. Alternatively, the first integrated circuit 120 and the second integrated circuit 130 may each implement a GPU subsystem. Furthermore, the interconnect substrate 110 may be coupled to additional chips (e.g. memory chips, GPU chips, etc.) to form a multi-chip system on a chip (SoC) device.

Self-Biased Equalizing Input Amplifier

Figure 2:
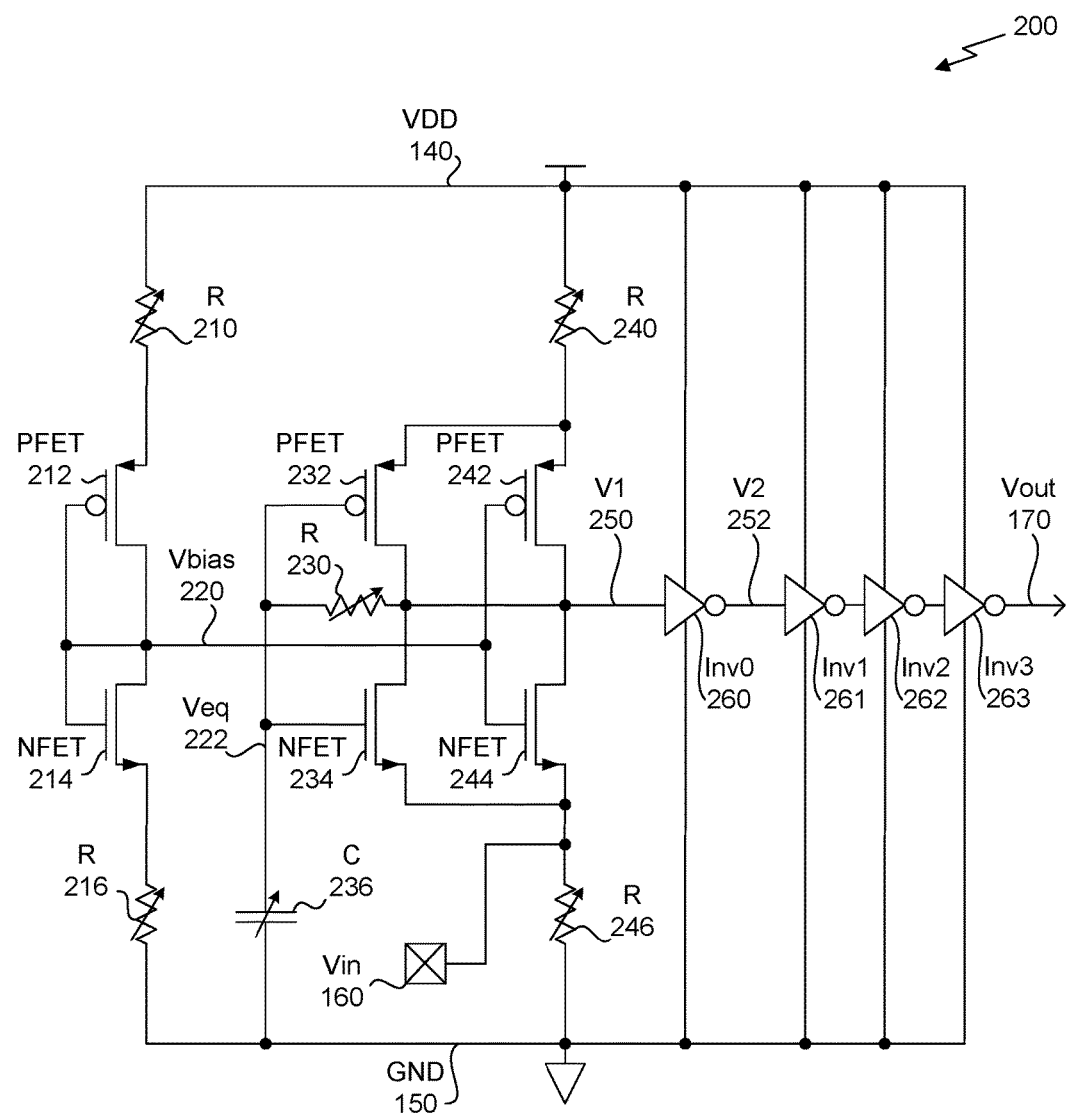
FIG. 2 illustrates a self-biased input receiver configured to amplify and equalize a ground-referenced single-ended input signal, in accordance with one embodiment.

FIG. 2 illustrates a self-biased input receiver 200 configured to amplify and equalize a ground-referenced single-ended input signal, in accordance with one embodiment. In one embodiment, input receiver 132 of FIG. 1 comprises an instance of input receiver 200.

As shown, the input receiver 200 includes a bias circuit, comprising resistive element ("R") 210, PFET 212, NFET 214, and resistive element 216. Furthermore, the input receiver 200 also includes a common-gate amplifier with a gyrator-C load, comprising resistive element 240, PFET 242, NFET 244, resistive element 246, PFET 232, NFET 234, resistive element 230, and capacitive element ("C")

236. The common-gate amplifier receives input signal Vin 160 and generates an output signal V1 250. In one embodiment, the output signal V1 250 is coupled to an output buffer circuit to generate output signal Vout 170. As shown, the output buffer circuit may be implemented as a chain of inverters inv0 260, inv1 261, inv2 262, and inv3 263.

In one embodiment, one or more of the resistive elements 210, 216, 230, 240, 246 may be implemented as a digitally adjustable resistive element. A given digitally adjustable resistive element provides one of two or more resistance values selected by a digital control value. Exemplary circuits for a digitally adjustable resistive element are disclosed herein; however, any digitally adjustable resistive element circuit may be implemented instead without departing the scope of embodiments of the present disclosure.

In one embodiment, capacitive element 236 is implemented as a digitally adjustable capacitive element. A given digitally adjustable capacitive element provides one of two or more capacitance values selected by a digital control value. An exemplary circuit for a digitally adjustable capacitive element is disclosed herein; however, any digitally adjustable capacitive element circuit may be implemented instead without departing the scope of embodiments of the present disclosure.

In one embodiment, one or more of PFETS 212, 232, 242 are implemented as digitally adjustable PFETS, configured to present one of two or more selected effective transistor sizes. Furthermore, one or more of NFETS 214, 234, 244 are implemented as digitally adjustable NFETS, configured to present one of two or more selected effective transistor sizes. An exemplary circuit for a digitally adjustable PFET and an exemplary circuit for a digitally adjustable NFET are disclosed herein; however, any digitally adjustable PFET and/or NFET circuits may be implemented instead without departing the scope of embodiments of the present disclosure.

The bias circuit generates bias voltage Vbias 220, which may be adjusted to a higher or lower voltage level by adjusting the resistance values of resistive element 210 and/or resistive element 216. The bias voltage Vbias 220 may be further adjusted by adjusting effective transistor sizes for PFET 212 and NFET 214, for example, to track effective sizes of PFETS 232, 242 and NFETS 234, 244.

Input signal Vin 160 is terminated, at least in part, by resistive element 246. In one embodiment, resistive element 246 is adjusted initially to match a nominal impedance of transmission line 112. Resistive element 246 may be adjusted further in connection with a link training procedure to minimize bit error rates in a received data signal, such as data signal 134.

The common-gate amplifier is biased by bias voltage Vbias 220. In one embodiment, PFET 242 and NFET 244 are biased to operate in respective saturation regions while biasing the common-mode voltage of output signal V1 250 to be half way between VDD 140 and GND 150. Furthermore, PFET 232 and NFET 234 are biased to operate in respective saturation regions.

The common-gate amplifier includes a gyrator-C network as an amplifying structure to achieve peaking within an associated voltage gain transfer function. Signal equalization is achieved by an impedance transformation within a negative feedback loop that provides an equivalent inductive impedance within the signal amplification path at higher frequencies. Signal equalization magnitude can be controlled through a sizing ratio between the transistors in equalizer and amplifier branches (e.g. the sizes of PFET 232 and NFET 234 to the sizes of PFET 242 and NFET 244), which determines the equivalent inductive impedance at high-frequencies and the amount of gain suppression that occurs at low-frequencies due to the equivalent low-output impedance provided by the gyrator-C network comprised of resistor 230, PFET 232, NFET 234, and capacitor 236. The magnitude and center (peak) frequency of the voltage gain can also be controlled by adjusting feedback resistive element 230 and feedback capacitive element 236. The effective inductive impedance provides an under-damped transient response to increase signal gain at the peak frequency. This configuration also provides signal isolation from feedback capacitive element 236 and thereby avoids introducing a dominant pole that would otherwise degrade amplification bandwidth.

As shown, capacitive element 236 is coupled to GND 150. In this context, GND 150 is both an alternating current (AC) ground and a direct current (DC) ground. In alternative embodiments, capacitive element 236 may be instead coupled to any other AC ground, including VDD 140.

Furthermore, a DC operating point of the self-biased input receiver 200 may also be tuned by adjusting Vbias 220, resistive element 240, and effective transistor sizes of PFETS 212, 232, 242 and NFETS 214, 234, 244.

Tunable resistive degeneration can be provided by resistive element 240 and implemented to adjust individual DC operating points of PFETS 232, 242 and NFETS 234, 244, including the common mode voltage for output signal V1 250. In certain embodiments, tunable resistive degeneration may be applied to inverter inv0 260 and/or inverter inv1 261. For example, a first digitally adjustable resistive element may be included between VDD 140 and a positive supply node for inverter inv0 260 and a second digitally adjustable resistive element may be included between GND 150 and a negative supply node for inverter inv0 260. The first and second digitally adjustable resistive elements may be varied together or separately to provide tunable resistive degeneration for inverter inv0 260.

Figure 3A:
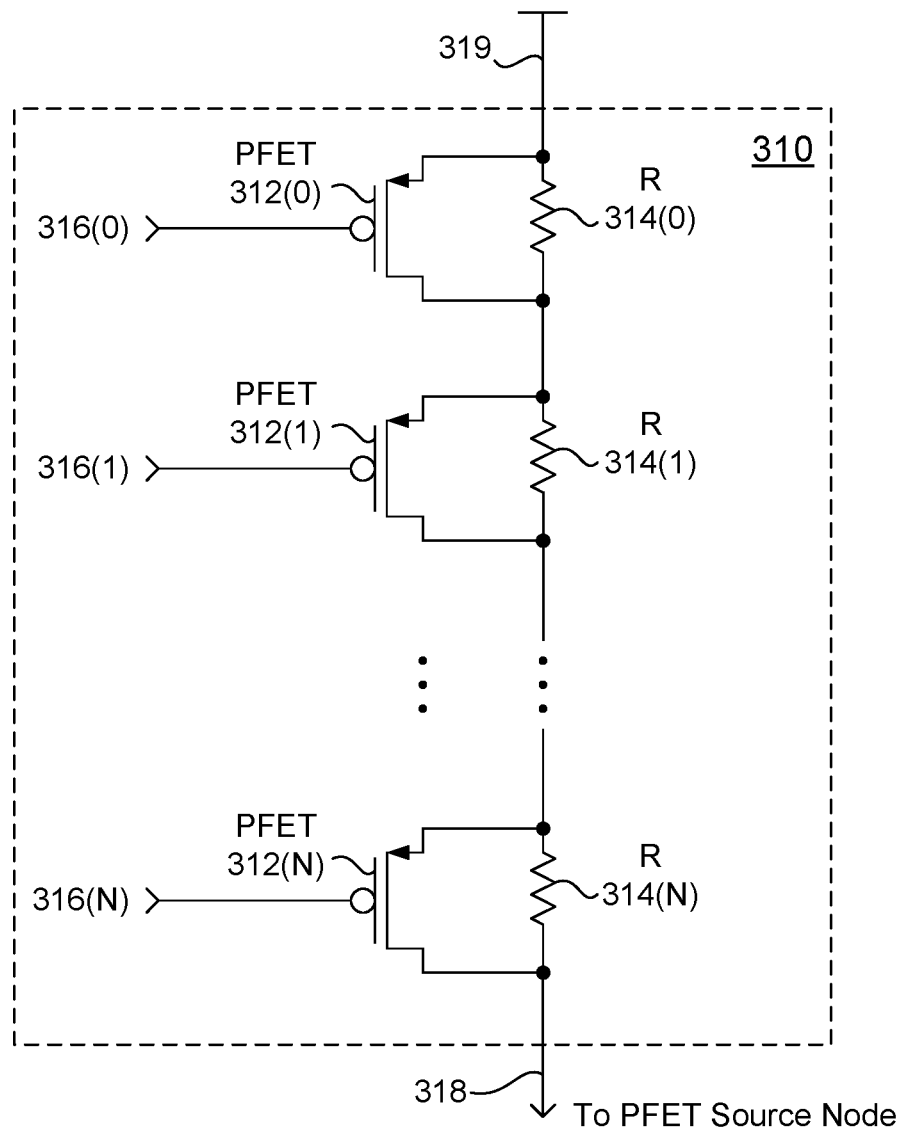
FIG. 3A illustrates a digitally adjustable resistive element coupled to a positive supply rail, in accordance with one embodiment.

FIG. 3A illustrates a digitally adjustable resistive element 310 coupled to a positive supply rail 319 (e.g. VDD 140), in accordance with one embodiment. As shown, the digitally adjustable resistive element 310 includes resistors 314(0) through 314(N), and PFETs 312(0) through 312(N). The resistors 314 are organized to form a series resistor string between the positive supply rail 319 and an output node 318, where each PFET 312 is coupled in parallel with a corresponding resistor 314 in the series resistor string. In the context of various embodiments disclosed herein (e.g. input receiver 200 of FIG. 2), output node 318 may be coupled to one or more PFET source nodes.

In certain embodiments, each PFET 312 is configured to selectively shunt a corresponding resistor 314. In one embodiment, at least one resistor 314 included in the series resistor string is not coupled to a corresponding PFET 312, for example to set a minimum resistance. A given PFET 312 can be enabled or disabled based on the state of a digital control signal 316 coupled to the gate node of the PFET 312. The state of a given digital control signal 316 can be driven to either a logical one level to turn off the PFET 312, or a logical zero level to turn on the PFET 312. As shown, digital control signal 316(0) is coupled to the gate node of PFET 312(0). When digital control signal 316(0) is driven to a logical zero level, PFET 312(0) is turned on and shunts current through resistor 314(0), effectively eliminating a resistance contribution from resistor 314(0) to the total resistance of the series resistor string. When digital control signal 316(0) is driven to a logical one level, PFET 312(0)

is turned off and resistor 314(0) is able to fully contribute resistance to the total resistance of the series resistor string.

In the present description, N is equal to the number of resistors R 314 minus one. In one embodiment, resistors 314 are fabricated to have resistance values of increasing integer powers of two. For example, resistor 314(0) may have a resistance value of 2^0 Ohm; resistor 314(1) may have a resistance value of 2^1 Ohms; and so forth with resistor 314(N) having a resistance value of 2^N Ohms. Continuing the example, if N is equal to three, resistors 314(0)-314(N) will have resistance values of one, two, four, and eight Ohms, respectively. In this example, the digitally adjustable resistive element 310 would be able to provide an adjustable resistance from about less than one Ohm (all PFETS 312 turned on) to fifteen Ohms (all PFETS 312 turned off) in one Ohm steps. Resistance values for resistors 314 may be scaled appropriately according to specific implementation requirements.

In one embodiment, a digital control value for the digitally adjustable resistive element 310 is defined by digital control signals 316(N)-316(0). For example, digital control signals 316(N)-316(0) can collectively define a binary integer value for the digital control value, which can select one of two or more resistance values provided by the digitally adjustable resistive element 310. By implementing powers of two resistance values for resistors 314, the digitally adjustable resistive element 310 provides nominally monotonic resistance values corresponding to increasing digital control values and may provide relatively uniform resistance value steps.

In one embodiment, N is equal to three, four resistors 314(0)-314(3) form the series resistor string, and the digitally adjustable resistive element 310 provides sixteen different resistance values. Each of the sixteen different resistance values corresponds to one of sixteen different binary values indicated by a digital control value formed by four different digital control signals 316(0)-316(N). In another embodiment, N is equal to zero, one resistor 314(0) forms the series resistor string, and the digitally adjustable resistive element 310 provides one or two different resistance values. Each of the two different resistance values corresponds to one of two different binary values indicated by digital control signal 316(0). In other embodiments, two resistors, three resistors, or more than four resistors form the series resistor string.

In certain embodiments, at least one resistor 314 is fabricated from at least one material of poly-silicon, n-diffusion, p-diffusion, n-well, p-well, thin-film metal, metal-silicide, or a combination thereof.

In various embodiments, one or more resistive elements within an input receiver circuit disclosed herein (e.g., self-biased input receiver 200) may be implemented as an instance of digitally adjustable resistive element 310. For example, one or more of resistive elements 210 and 240 in FIG. 2 can each be implemented as an instance of the digitally adjustable resistive element 310. In one embodiment, digitally adjustable resistive element 310 can implement a variable resistive element, such as resistor 230. In such an embodiment, output node 318 is coupled to Veq 222 and PFET 312(0) is coupled to V1 250 rather than positive supply rail 319.

Figure 3B:
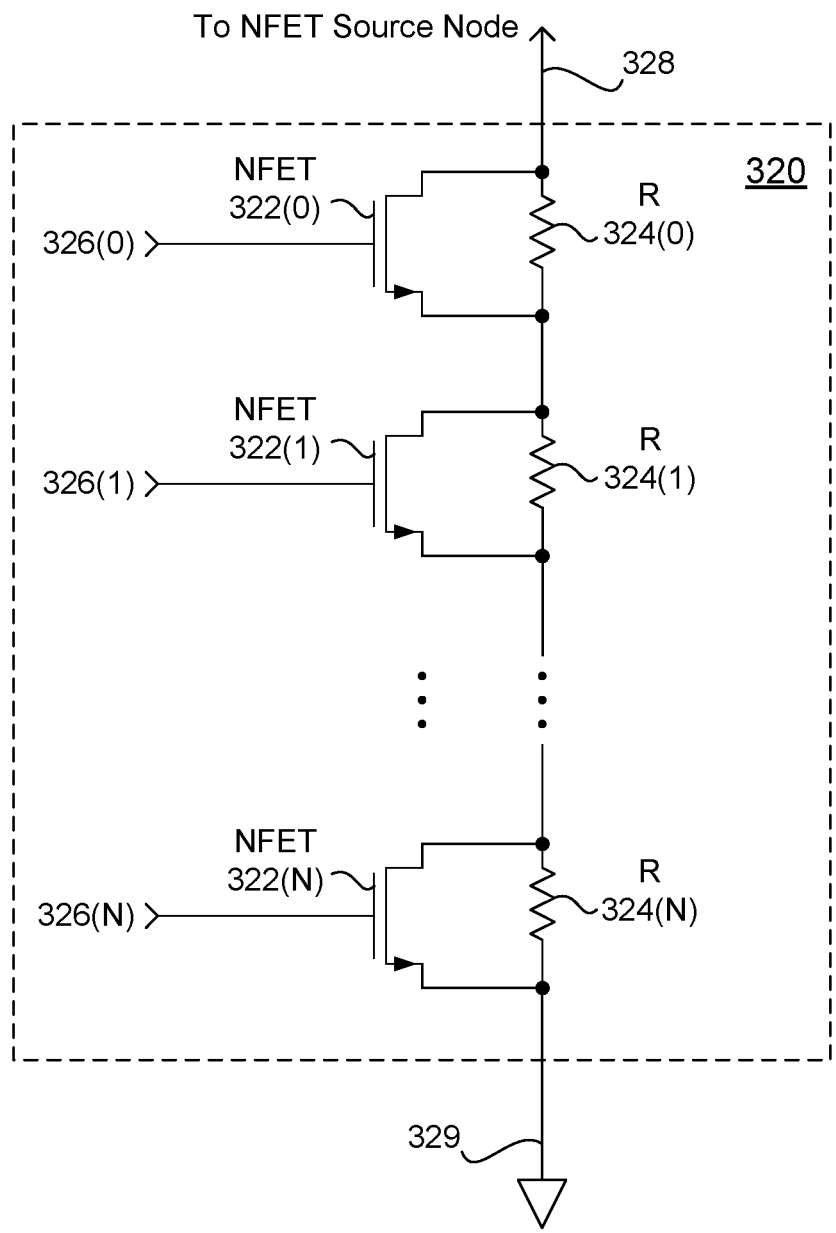
FIG. 3B illustrates a digitally adjustable resistive element coupled to a negative supply rail, in accordance with one embodiment.

FIG. 3B illustrates a digitally adjustable resistive element 320 coupled to a negative supply rail 329 (e.g., GND 150), in accordance with one embodiment. As shown, the digitally adjustable resistive element 320 includes resistors 324(0) through 324(N), and NFETs 322(0) through 322(N). The resistors 324 are organized to form a series resistor string between the negative supply rail 329 and an output node 328, where each NFET 322 is coupled in parallel with a corresponding resistor 324 in the series resistor string. In the context of various embodiments disclosed herein (e.g. input receiver 200 of FIG. 2), output node 328 may be coupled to one or more NFET source nodes.

Digitally adjustable resistive element 320 can be fabricated and operated analogously to digitally adjustable resistive element 310 of FIG. 3A, with three differences. First, digitally adjustable resistive element 320 includes NFETS 322 rather than PFETS 312. Second, digital control signals 326 are active high (logical one level turns on NFETS 326) rather than active low (logical zero level turns on PFETS 312). Third, one end of the series resistor string is coupled to a negative supply rail 319 (e.g., GND 150) rather than a positive supply rail.

In various embodiments, one or more resistive elements within an input receiver circuit disclosed herein (e.g., self-biased input receiver 200) may be implemented as an instance of the digitally adjustable resistive element 320. For example, one or more of resistive elements 216 and 246 in FIG. 2 can each be implemented as an instance of the digitally adjustable resistive element 320. In one embodiment, digitally adjustable resistive element 320 can implement a variable resistive element, such as resistor 230. In such an embodiment, output node 328 is coupled to Veq 222 and NFET 322(N) is coupled to V1 250 rather than negative supply rail 329.

In an alternative embodiment, pass gates are used instead of NFETS 322. In such an embodiment, inverters may also be included to provide inverted sense versions of digital control signals 326 for driving the pass gates. One such application of the alternative pass gate embodiment is in the implementation of resistor 230. In various embodiments, NFETS and/or PFETS configured to receive digital control signals in the digitally adjustable circuit elements disclosed herein may be replaced with pass gates. More specifically, one or more of PFETS 312 of FIG. 3A, NFETS 322, PFETS 332 of FIG. 3C, NFETS 412 of FIG. 4, PFETS 522 of FIG. 5A, and NFETS 542 of FIG. 5B may be replaced with pass gates.

Figure 3C:
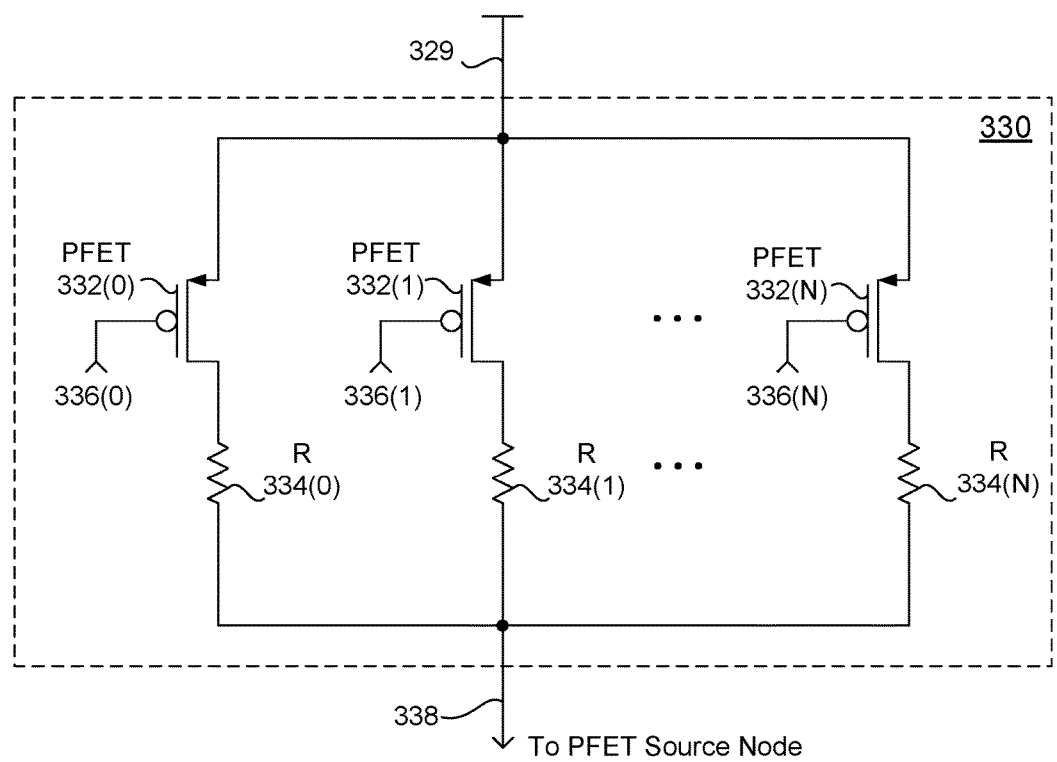
FIG. 3C illustrates an alternative digitally adjustable resistive element coupled to a positive supply rail, in accordance with one embodiment.

FIG. 3C illustrates an alternative digitally adjustable resistive element 330 coupled to a positive supply rail 329 (e.g., VDD 140), in accordance with one embodiment. As shown, the digitally adjustable resistive element 330 includes resistors 334(0) through 334(N), and PFETs 332(0) through 332(N). The resistors 334 are organized to form a parallel resistor network between the positive supply rail 329 and an output node 338, with a different PFET 332 coupled in series with a corresponding resistor 334. In the context of various embodiments disclosed herein (e.g. input receiver 200 of FIG. 2), an output node 338 is coupled to one or more PFET source nodes.

In one embodiment, a given PFET 332 can be enabled or disabled based on the state of a digital control signal 336 coupled to the gate node of the PFET 332. The state of a given digital control signal 336 can be driven to either a logical one level to turn off the PFET 332, or a logical zero level to turn on the PFET 332. As shown, digital control signal 336(0) is coupled to the gate node of PFET 332(0). When digital control signal 336(0) is driven to a logical zero level, PFET 332(0) is turned on, thereby including a parallel resistance contribution from resistor 334(0) in the parallel resistor network. When digital control signal 336(0) is driven to a logical one level, PFET 332(0) is turned off and resistor 334(0) is effectively not included in the parallel resistor network.

In one embodiment, a digital control value for the digitally adjustable resistive element 330 is defined by digital control signals 336(N)-336(0). For example, digital control signals 336(N)-336(0) can collectively define a binary integer value for the digital control value, which can select one of two or more resistance values provided by the digitally adjustable resistive element 330. Any technically feasible resistance ratio may be implemented to provide a set of specified resistance values for the digitally adjustable resistive element 330.

In various embodiments, one or more resistive elements within an input receiver circuit disclosed herein (e.g., self-biased input receiver 200) may be implemented as an instance of the digitally adjustable resistive element 330. For example, one or more of resistive elements 210 and 240 in FIG. 2 can each be implemented as an instance of the digitally adjustable resistive element 330.

Figure 4:
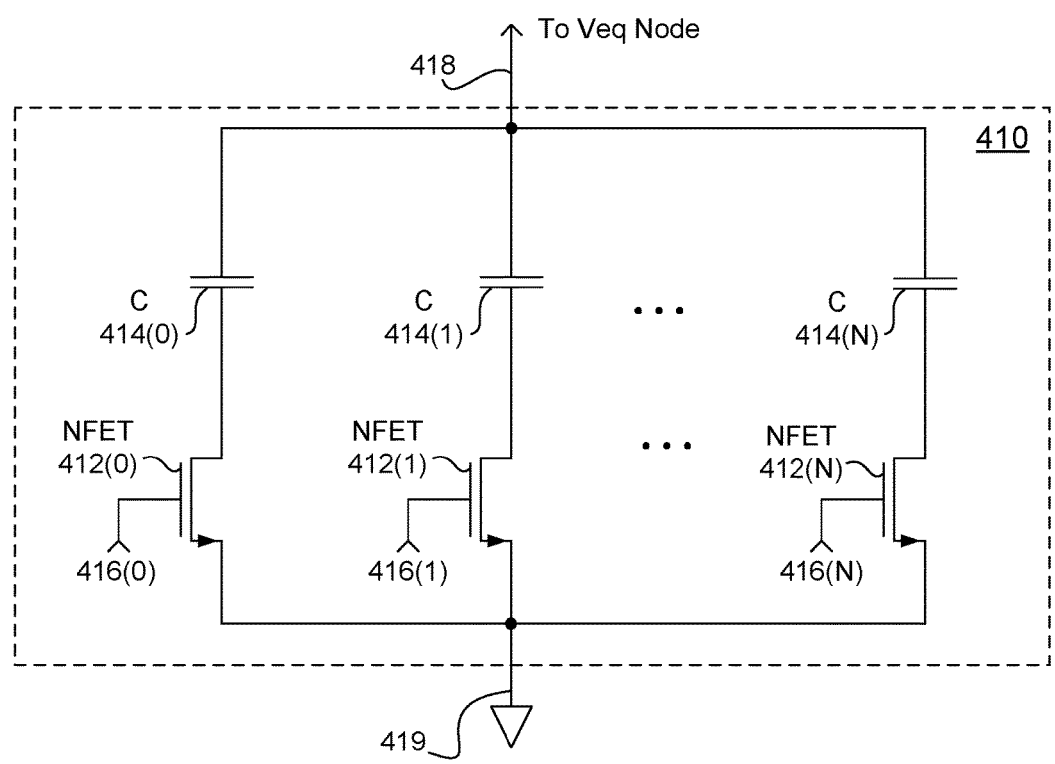
FIG. 4 illustrates a digitally adjustable capacitive element coupled to a negative supply rail, in accordance with one embodiment.

FIG. 4 illustrates a digitally adjustable capacitive element 410 coupled to a negative supply rail 419, (e.g., GND 150) in accordance with one embodiment. As shown, the digitally adjustable capacitive element 410 includes capacitors 414(0) through 414(N), coupled to output node 418 through corresponding NFETS 412. The capacitors 414 are organized to form a parallel capacitor network, with each capacitor 414 selectively included in parallel to the parallel capacitor network by enabling a corresponding NFET 412. In one embodiment, capacitor 236 of FIG. 2 is implemented as an instance of the digitally adjustable capacitive element 410, wherein output node 418 is coupled to Veq 222.

In one embodiment, a digital control value for the digitally adjustable capacitive element 410 is defined by digital control signals 416(N)-416(0). For example, digital control signals 416(N)-416(0) can collectively define a binary integer value for the digital control values, which can select one of two or more capacitance values provided by the digitally adjustable capacitive element 410. Any technically feasible capacitance values may be implemented to provide a set of specified capacitance values for the digitally adjustable capacitive element 410. In one embodiment, capacitors 414(0) through 414(N) are designed to have increasing integer powers of two capacitance values, and the digitally adjustable capacitive element 410 provides nominally monotonic capacitance values corresponding to increasing digital control values. Such an embodiment may provide relatively uniform capacitance value steps.

In one embodiment, N is equal to three, four capacitors 414(0)-414(3) form the parallel capacitor network, and the digitally adjustable capacitive element 410 provides sixteen different capacitance values. Each of the sixteen different capacitance values corresponds to one of sixteen different binary values indicated by a digital control value formed by four different digital control signals 416(0)-416(3). When the digital control value is equal to zero, digital control signals 416(0)-416(3) are driven to a logical zero level and NFETS 412(0)-412(3) are turned off. In this case, the capacitance value presented to output node 418 is essentially the combined parasitic capacitance associated with the drain nodes of NFETS 412.

In certain embodiments, at least one capacitor 414 is fabricated from at least one of a gate of a PFET and/or NFET transistor, an n-diffusion region, a p-diffusion region, an n-well region, a p-well region, a parallel metal structure (e.g., interleaved in different metal layers), or a combination thereof. Additional capacitive structures may also be implemented without departing the scope and spirit of various embodiments.

Figure 5A:
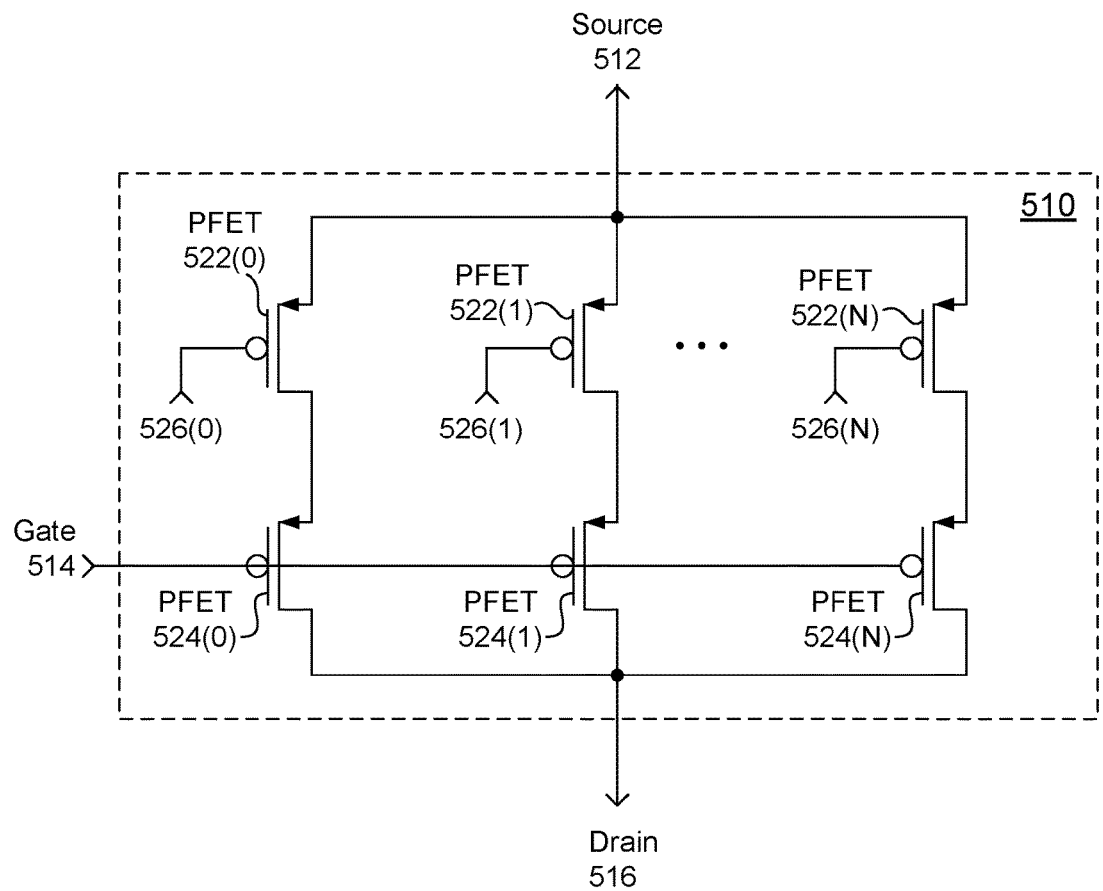
FIG. 5A illustrates a digitally adjustable p-channel field effect transistor, in accordance with one embodiment.

FIG. 5A illustrates a digitally adjustable p-channel field effect transistor 510, in accordance with one embodiment. As shown, the digitally adjustable p-channel field effect transistor 510 presents a source node 512, a gate node 514, and a drain node 516. Source nodes of PFETS 522 are coupled to the source node 512, while drain nodes of PFETS 524 are coupled to drain node 516. The gate node 514 is coupled to gate nodes of PFETS 524. A given drain node for each PFET 522 is coupled to a source node for a corresponding PFET 524.

In one embodiment, a digital control value for the digitally adjustable p-channel field effect transistor 510 is defined by digital control signals 526(N)-526(0). Collectively, the digital control signals 526 determine an effective transistor size for the digitally adjustable p-channel field effect transistor 510. Each different pair of a given PFET 522 and a corresponding PFET 524 can be switched in or switched out of a parallel PFET network comprising PFETS 522 and PFETS 524. Implementing different size combinations for PFETS 522 and PFETS 524 may provide a range of potential effective transistor sizes for the digitally adjustable p-channel field effect transistor 510, with one effective transistor size selected by the digital control signals 526(N)-526(0). In general, the effective transistor size is a measure of an effective gate length and gate width, and in particular the gate length and gate width of PFETS 524, with PFETS 522 serving to either enable or disable specific PFETS 524 from contributing to an effective transistor size for the digitally adjustable p-channel field effect transistor 510. In various embodiments, PFETS 524 may be sized to provide an appropriate range and granularity of effective transistor sizes, with one effective transistor size selected at a time by the digital control value.

In various embodiments, a given PFET device may be implemented as a fixed-size PFET, or implemented as an instance of the digitally adjustable p-channel field effect transistor 510. For example, one or more of PFETS 212, 232, and 242 of FIG. 2 may be implemented as different instances of digitally adjustable p-channel field effect transistor 510.

Figure 5B:
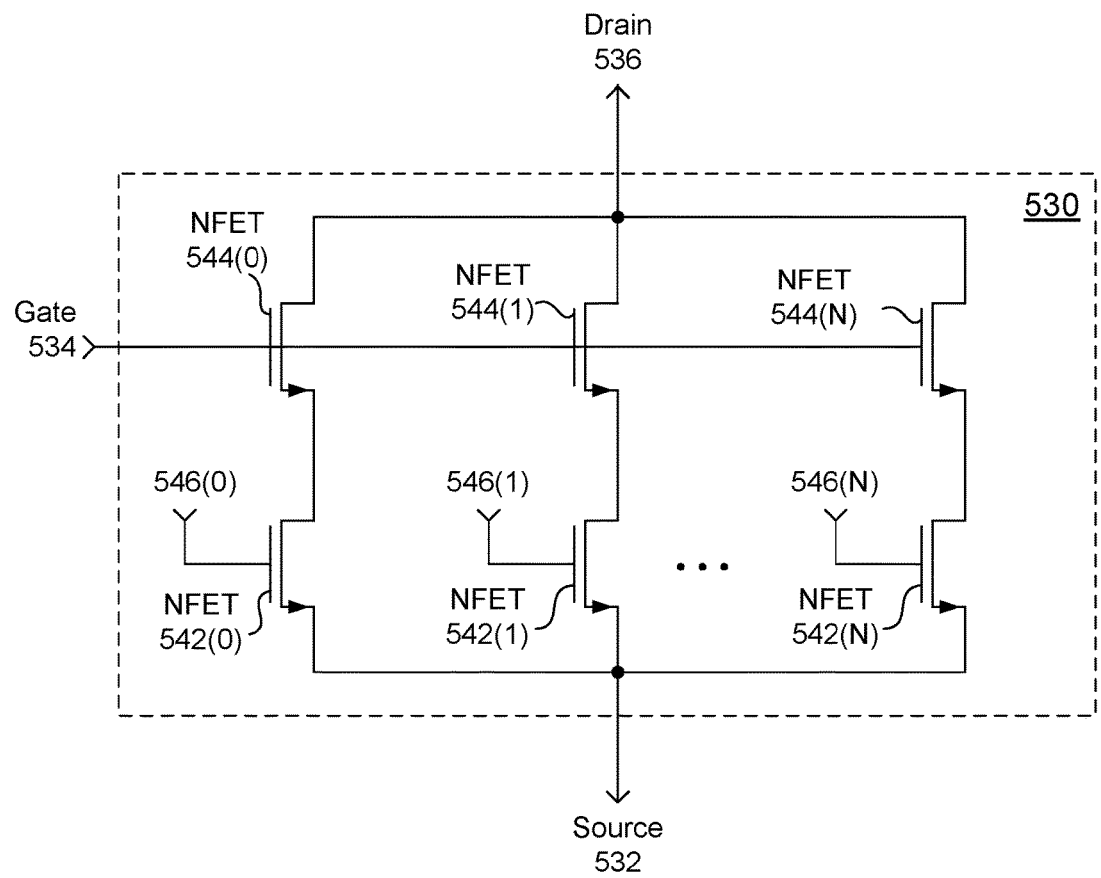
FIG. 5B illustrates a digitally adjustable n-channel field effect transistor, in accordance with one embodiment.

FIG. 5B illustrates a digitally adjustable n-channel field effect transistor 530, in accordance with one embodiment. As shown, the digitally adjustable n-channel field effect transistor 530 presents a source node 532, a gate node 534, and a drain node 536. Source nodes for NFETS 542 are coupled to the source node 532, while drain nodes for NFETS 544 are coupled to drain node 536. The gate node 534 is coupled to gate nodes for NFETS 544. A given drain node for each NFET 542 is coupled to a source node for a corresponding NFET 544. The digitally adjustable n-channel field effect transistor 530 operates analogously to that of digitally adjustable p-channel field effect transistor 510, but with NFETS rather than PFETS.

In one embodiment, a digital control value for the digitally adjustable n-channel field effect transistor 530 is defined by digital control signals 546(N)-546(0). Collectively, the digital control signals 546 determine an effective transistor size for the digitally adjustable n-channel field effect transistor 530. Each different pair of a given NFET 542 and a corresponding NFET 544 can be switched in or switched out of a parallel NFET network comprising NFETS 542 and NFETS 544. Implementing different size combinations for NFETS 542 and NFETS 544 may provide a range of potential effective transistor sizes for the digitally adjustable n-channel field effect transistor 530, with one effective transistor size selected by the digital control signals 546(N)-546(0).

In various embodiments, a given NFET device may be implemented as a fixed-size NFET, or implemented as an instance of the digitally adjustable n-channel field effect transistor 530. For example, one or more of NFETS 214, 234, and 244 of FIG. 2 may be implemented as different instances of digitally adjustable p-channel field effect transistor 530.

Figure 6:
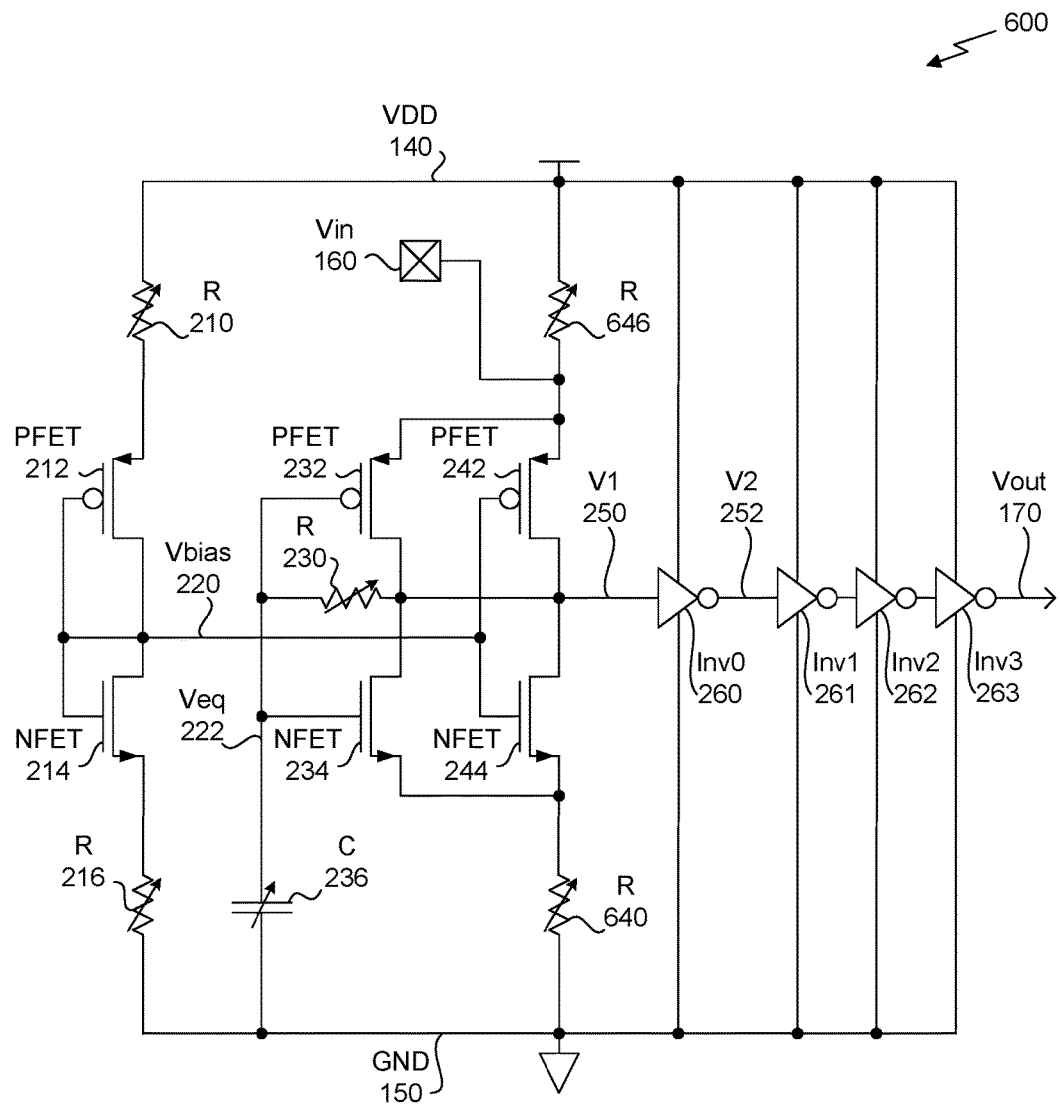
FIG. 6 illustrates a self-biased input receiver configured to amplify and equalize a supply-referenced single-ended input signal, in accordance with one embodiment.

FIG. 6 illustrates a self-biased input receiver 600 configured to amplify and equalize a supply-referenced single-ended input signal, in accordance with one embodiment. In one embodiment, input receiver 132 of FIG. 1 comprises an instance of input receiver 600.

As shown, self-biased input receiver 600 is topologically and operationally identical to self-biased input receiver 200, with the exceptions of input signal Vin 160 being terminated to VDD 140 through resistive element 646 rather than to GND 150 through resistive element 246, and PFETS 232 and 242 are configured to receive input signal Vin 160 rather than NFETS 234 and 244.

Figure 7:
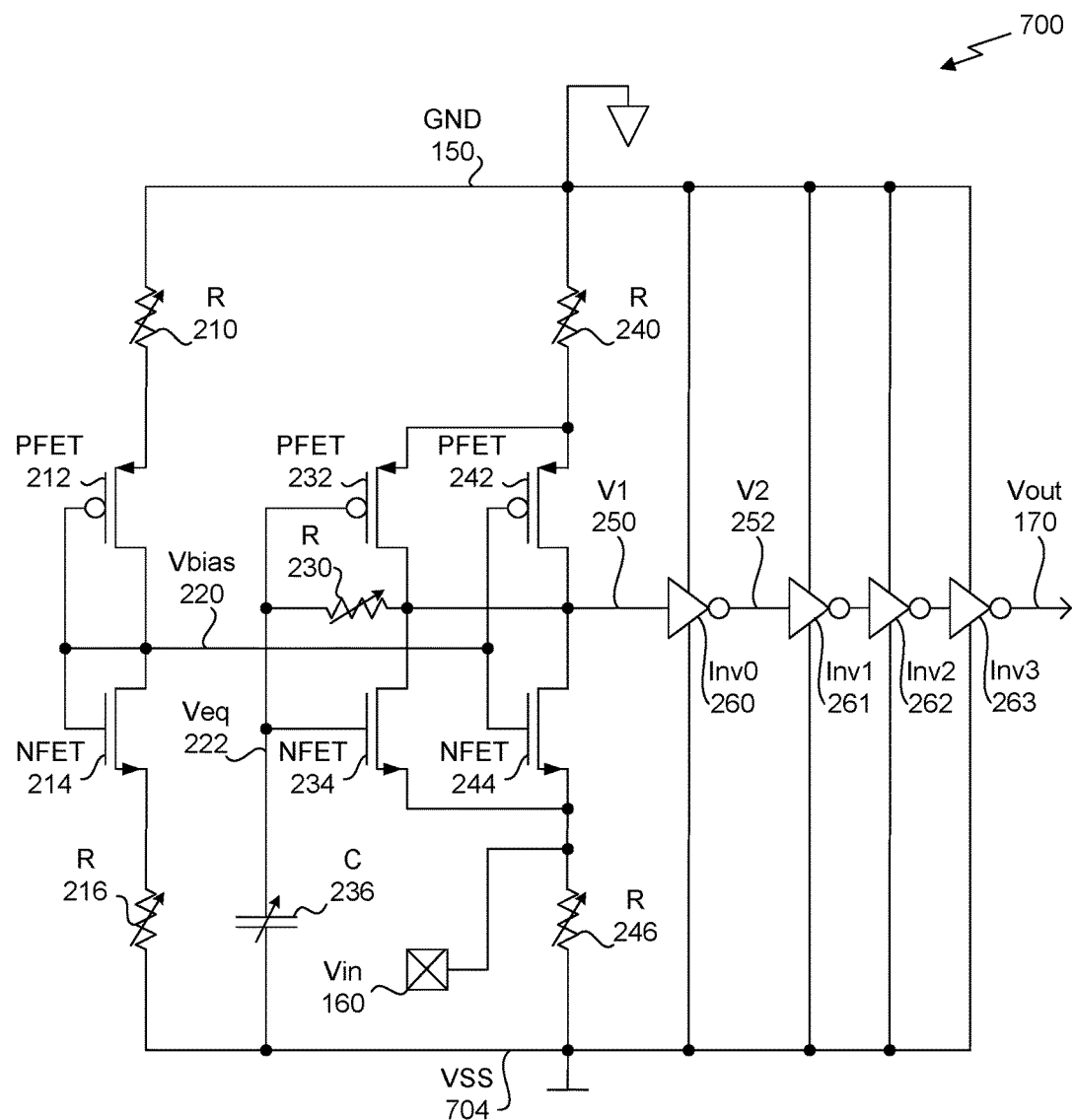
FIG. 7 illustrates a self-biased input receiver configured to amplify and equalize a single-ended input signal in a first negative supply mode, in accordance with one embodiment.

FIG. 7 illustrates a self-biased input receiver configured to amplify and equalize a single-ended input signal in a first negative supply mode, in accordance with one embodiment. In one embodiment, input receiver 132 of FIG. 1 comprises an instance of input receiver 700.

As shown, self-biased input receiver 700 is topologically and operationally identical to self-biased input receiver 200, with the exceptions of input signal Vin 160 being terminated to negative supply rail VSS 704 rather than to GND 150, and rather than being supplied electrical power through positive supply rail VDD 140 and ground rail GND 150, the self-biased input receiver 700 is instead supplied electrical power by ground rail GND 150 and negative supply rail VSS 704, respectively.

Figure 8:
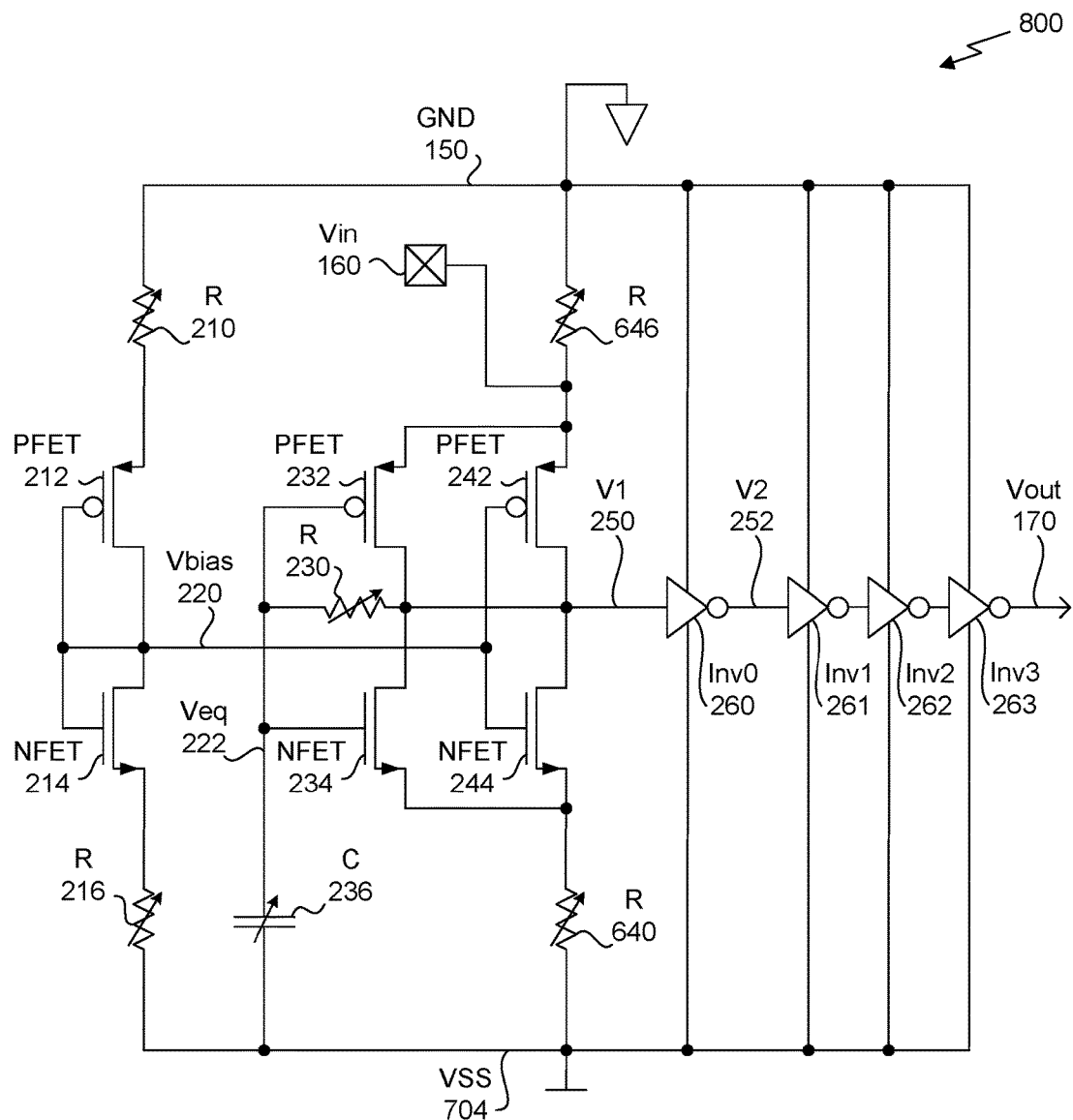
FIG. 8 illustrates a self-biased input receiver configured to amplify and equalize a single-ended input signal in a second negative supply mode, in accordance with one embodiment.

FIG. 8 illustrates a self-biased input receiver 800 configured to amplify and equalize a single-ended input signal in a second negative supply mode, in accordance with one embodiment. In one embodiment, input receiver 132 of FIG. 1 comprises an instance of input receiver 800.

As shown, self-biased input receiver 800 is topologically and operationally identical to self-biased input receiver 600, with the exceptions of input signal Vin 160 being terminated to negative supply rail VSS 704 rather than to GND 150, and rather than being supplied electrical power through positive supply rail VDD 140 and ground rail GND 150, the self-biased input receiver 800 is instead supplied electrical power by ground rail GND 150 and negative supply rail VSS 704, respectively.

The above embodiments of self-biased input receivers 200, 600, 700, 800 are illustrated as being implemented using PFETS and NFETS. However, in alternative embodiments, one or more of the PFETS and/or NFETS may be replaced with a bipolar junction transistor (BJT). For example a given PFET may be replaced with a PNP BJT, and a given NFET may be replaced with a NPN BJT. Collector nodes and emitter nodes for the BJTS may replace drain nodes and source nodes, respectively. In certain embodiments, the self-biased input receivers are implemented as a common-base amplifier topology.

Simulation Results

Various embodiments of self-biased input receivers 200, 600, 700, and 800 may be implemented using conventional CMOS fabrication technology. Furthermore, the self-biased input receivers may be simulated under various conditions using simulation models for conventional CMOS devices. Exemplary simulation results for the self-biased input receivers 200, 600, 700, and 800 are shown in FIGS. 9A-9F. In FIGS. 9A-9F, M0, M1, M2, and M3 correspond to NFET 244, PFET 242, PFET 232, and NFET 234, respectively.

Figure 9A:
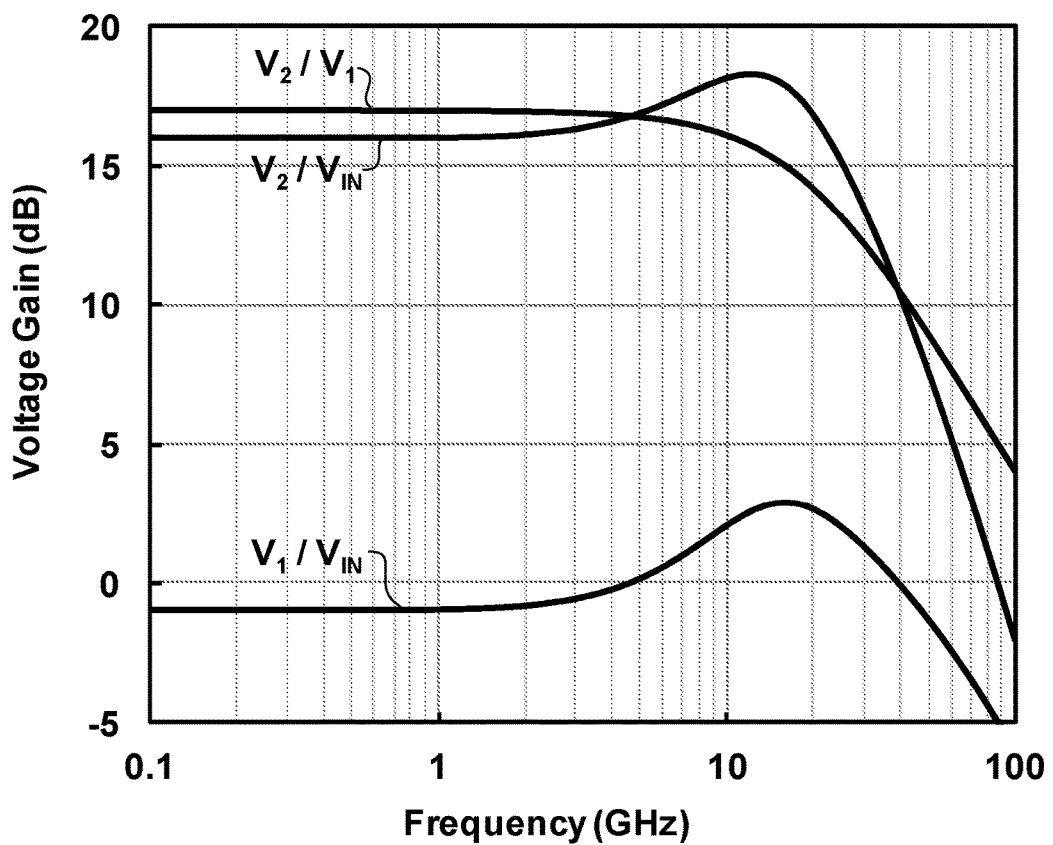
FIG. 9A illustrates simulated voltage gain in a self-biased input receiver configured to amplify and equalize a single-ended signal, in accordance with one embodiment.

FIG. 9A illustrates simulated voltage gain in a self-biased input receiver (e.g., self-biased input receiver 200 of FIG. 2) configured to amplify and equalize a single-ended signal, in accordance with one embodiment. As shown, a peak frequency ($f_o$) of 12.5 GHz is attained, given stated circuit element parameters.

Figure 9B:
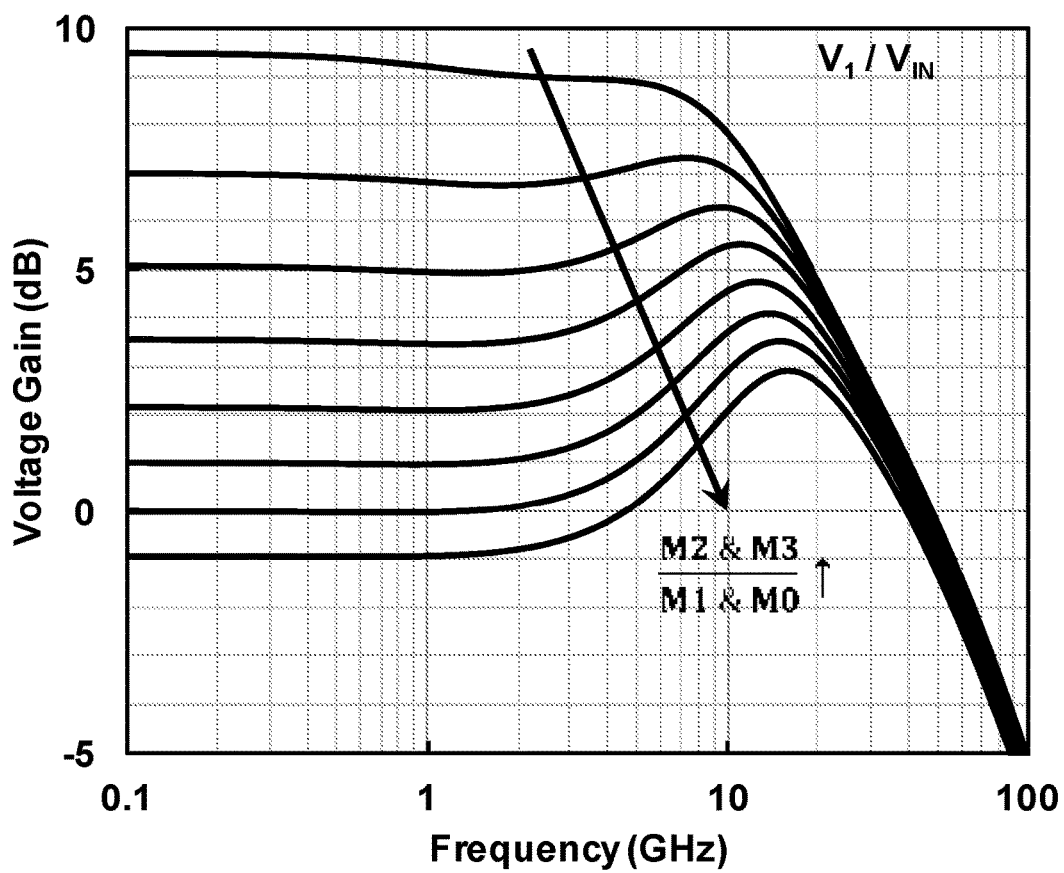
FIG. 9B illustrates simulated voltage gain as a function of transistor size in a self-biased input receiver configured to amplify and equalize a single-ended signal, in accordance with one embodiment.

FIG. 9B illustrates simulated voltage gain as a function of transistor size in a self-biased input receiver configured to amplify and equalize a single-ended signal, in accordance with one embodiment. As shown, varying a ratio of transistor sizes causes a peaking variation from 0 dB up to 3.8 dB. Varying the ratio of transistor sizes also causes a wide range in low-frequency gain. In this context voltage gain is measured as V1 250 over Vin 160.

Figure 9C:
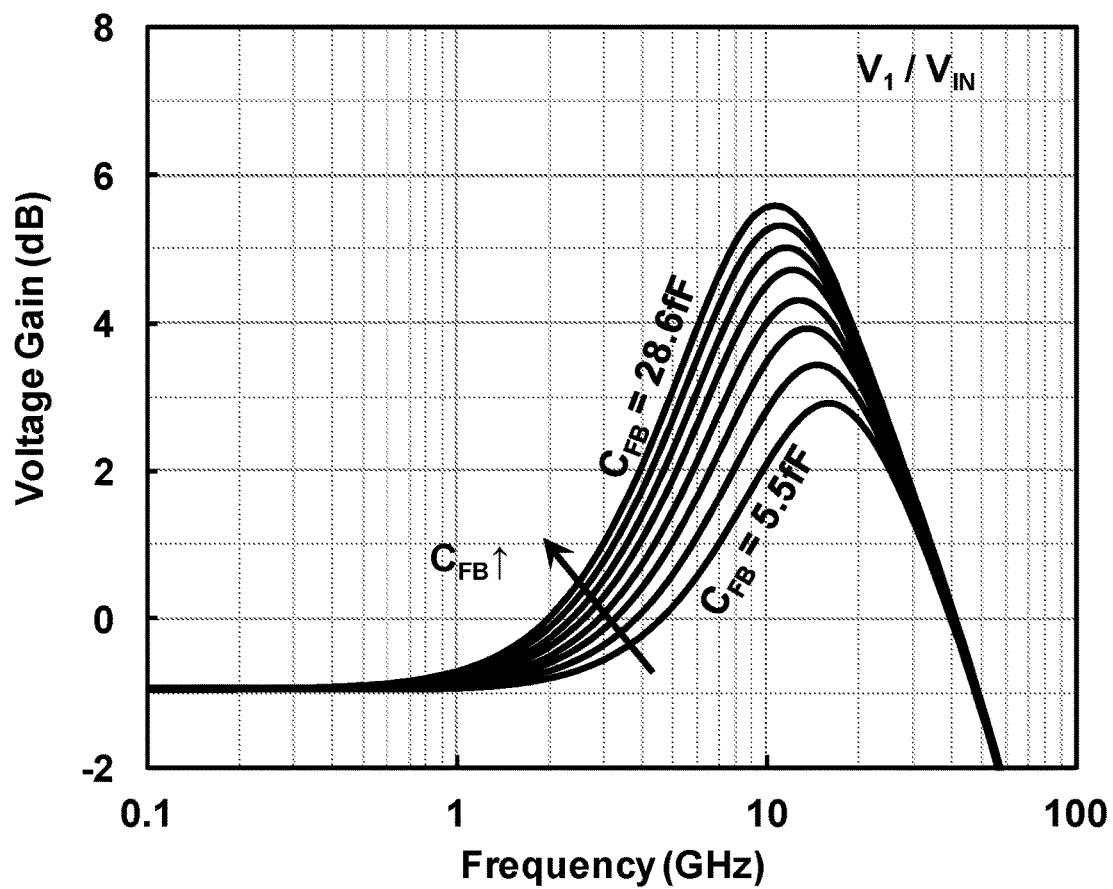
FIG. 9C illustrates simulated voltage gain as a function of feedback capacitance in a self-biased input receiver configured to amplify and equalize a single-ended signal, in accordance with one embodiment.

FIG. 9C illustrates simulated voltage gain as a function of feedback capacitance ($C_{FB}$) in a self-biased input receiver configured to amplify and equalize a single-ended signal, in accordance with one embodiment. As shown, with feedback resistive element 230 ($R_{FB}$) held constant at 1.1KΩ, and feedback capacitive element C 236 ($C_{FB}$) increased from 5.5 fF to 28.6 fF, the resulting peak frequency shifts from approximately 10.8 GHz down to 8.5 GHz. In this context voltage gain is measured as V1 250 over Vin 160.

Figure 9D:
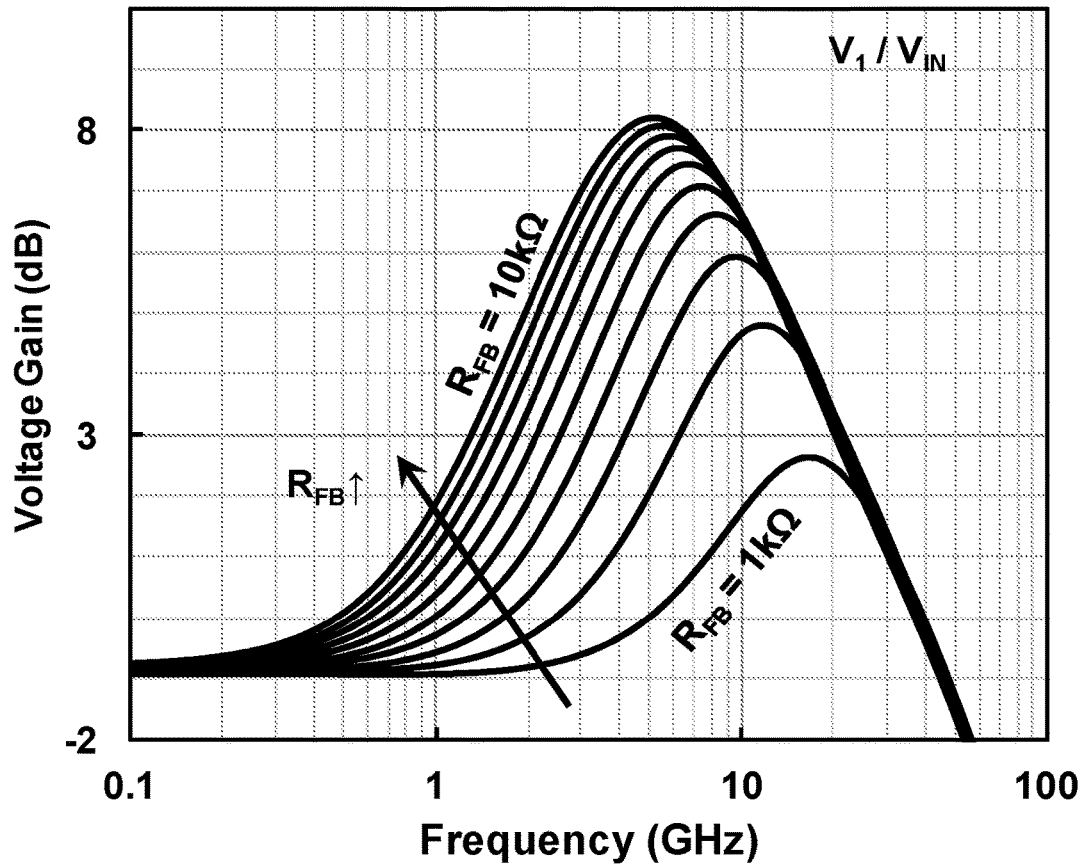
FIG. 9D illustrates simulated voltage gain as a function of feedback resistance in a self-biased input receiver configured to amplify and equalize a single-ended signal, in accordance with one embodiment.

FIG. 9D illustrates simulated voltage gain as a function of feedback resistance ($R_{FB}$) in a self-biased input receiver configured to amplify and equalize a single-ended signal, in accordance with one embodiment. As shown, with feedback capacitive element C 236 ($C_{FB}$) held constant at 5.5 fF and feedback resistive element 230 ($R_{FB}$) increasing from 1KΩ-10KΩ, the resulting peak frequency shifts from approximately 16.7 GHz down to 5.24 GHz. In this context voltage gain is measured as V1 250 over Vin 160. Also in this context, $R_{FB}$ and $C_{FB}$ are within typical resistance and capacitance parameters for conventional CMOS integrated circuits.

Figure 9E:
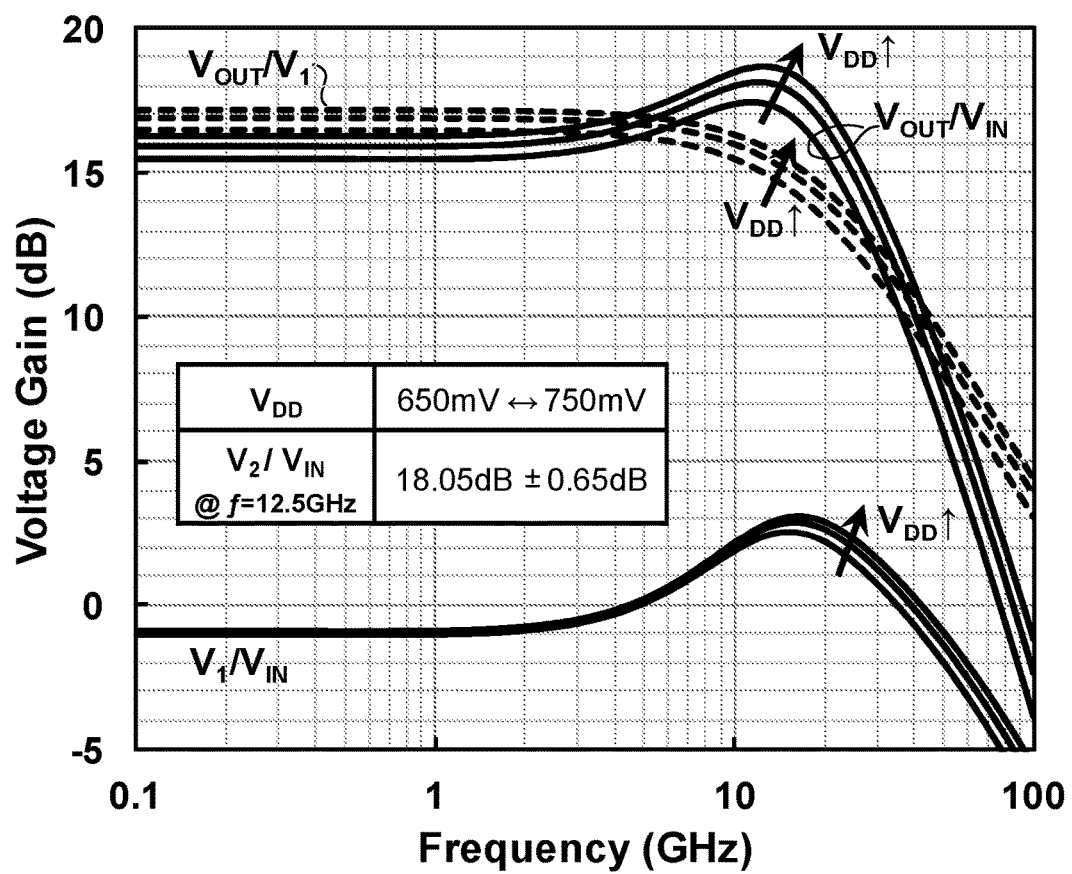
FIG. 9E illustrates simulated voltage gain as a function of supply voltage in a self-biased input receiver configured to amplify and equalize a single-ended signal, in accordance with one embodiment.

FIG. 9E illustrates simulated voltage gain as a function of supply voltage in a self-biased input receiver configured to amplify and equalize a single-ended signal, in accordance with one embodiment. In one embodiment, the supply voltage is a voltage difference between VDD 140 and GND 150, or between GND 150 and VSS 704. As shown, voltage gain varies by +/−0.65 dB at 12.5 GHz across a supply voltage range of 650 mV to 750 mV, a typical operating supply voltage range for conventional CMOS integrated circuits.

Figure 9F:
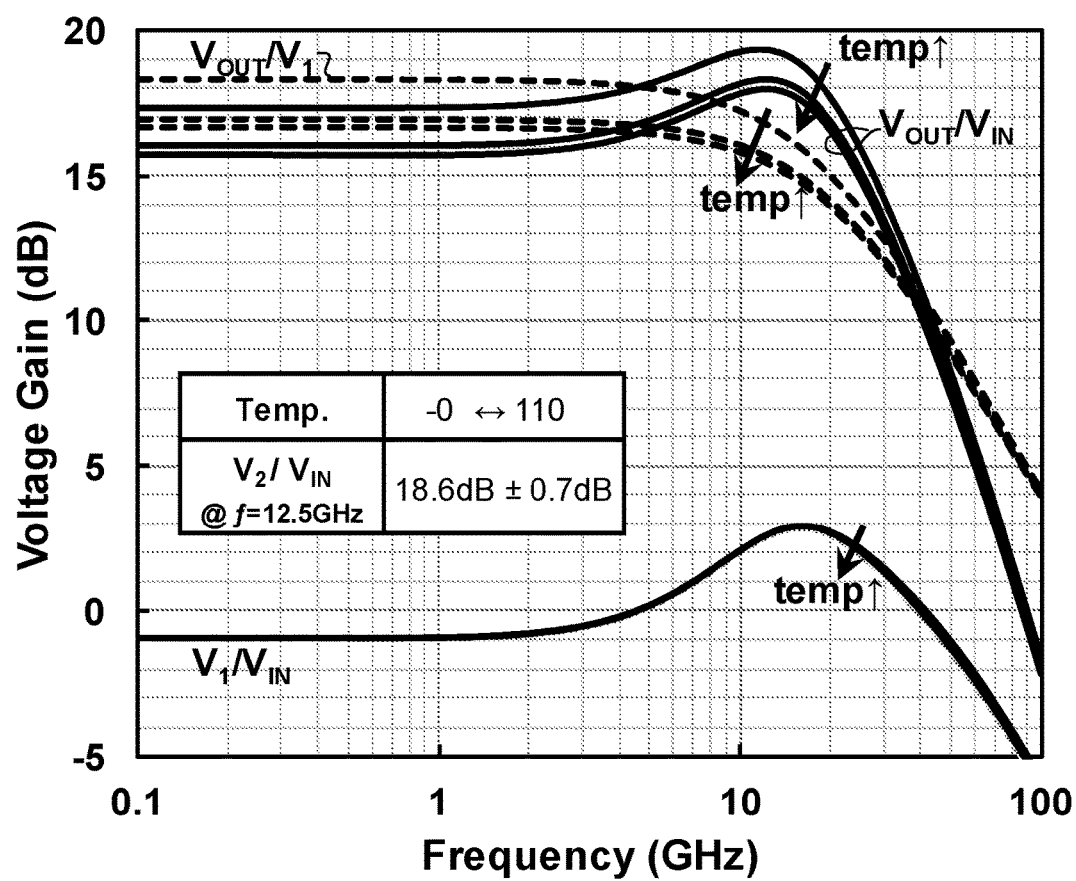
FIG. 9F illustrates simulated voltage gain as a function of temperature in a self-biased input receiver configured to amplify and equalize a single-ended signal, in accordance with one embodiment.

FIG. 9F illustrates simulated voltage gain as a function of temperature in a self-biased input receiver configured to amplify and equalize a single-ended signal, in accordance with one embodiment. In one embodiment, temperature is defined as device or junction temperature for the circuit elements comprising the input receiver circuit. As shown, voltage gain varies by 0.7 dB at 12.5 GHz as temperature varies from 0° C. to 110° C., a typical operating temperature range for conventional CMOS integrated circuits.

Generic Computing System

Figure 10:
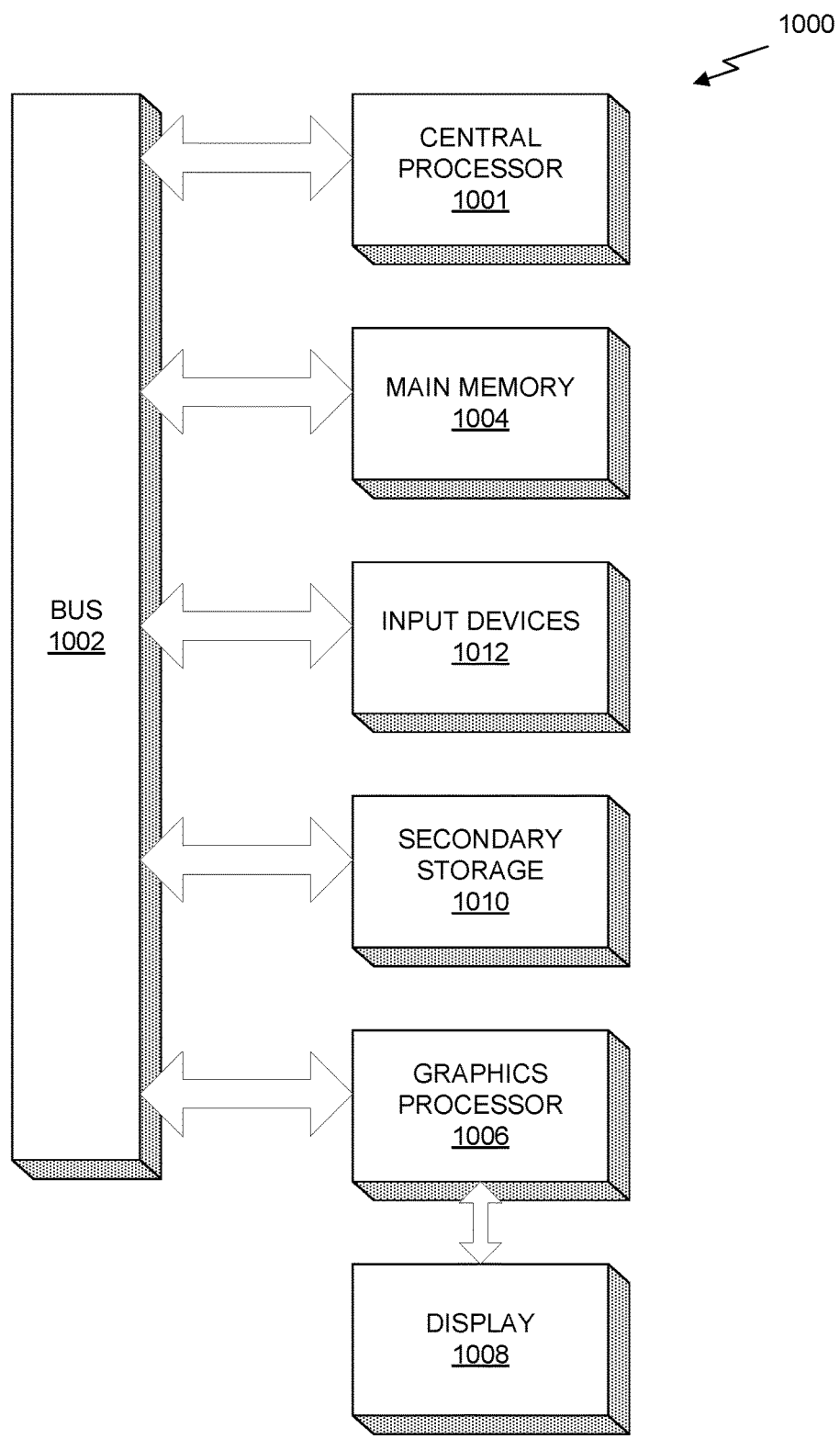
FIG. 10 illustrates an exemplary system in which the various architecture and/or functionality of the various previous embodiments may be implemented.

FIG. 10 illustrates an exemplary system 1000 in which the various architecture and/or functionality of the various previous embodiments may be implemented. As shown, a system 1000 is provided including at least one central processor 1001 that is connected to a communication bus 1002. The communication bus 1002 may be implemented using any suitable protocol, such as PCI (Peripheral Component Interconnect), PCI-Express, AGP (Accelerated Graphics Port), HyperTransport, or any other bus or point-to-point communication protocol(s). The system 1000 also includes a main memory 1004. Control logic (software) and data are stored in the main memory 1004 which may take the form of random access memory (RAM).

The system 1000 also includes input devices 1012, a graphics processor 1006, and a display 1008, i.e. a conventional CRT (cathode ray tube), LCD (liquid crystal display), LED (light emitting diode), plasma display or the like. User input may be received from the input devices 1012, e.g., keyboard, mouse, touchpad, microphone, and the like. In one embodiment, the graphics processor 1006 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. In certain embodiments, one or more instance of input receiver 200, 600, 700, or 800 is included in input/output circuitry configured to communicate between or among communication bus 1002, central processor 1001, main memory 1004, graphics processor 1006, or various subsystems therein.

The system 1000 may also include a secondary storage 1010. The secondary storage 1010 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1004 and/or the secondary storage 1010. Such computer programs, when executed, enable the system 1000 to perform various functions. The memory 1004, the storage 1010, and/or any other storage are possible examples of computer-readable media.

In one embodiment, the architecture and/or functionality of the various previous figures may be implemented in the context of the central processor 1001, the graphics processor 1006, an integrated circuit (not shown) that is capable of at least a portion of the capabilities of both the central processor 1001 and the graphics processor 1006, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1000 may take the form of a desktop computer, laptop computer, server, workstation, game consoles, embedded system, and/or any other type of logic. Still yet, the system 1000 may take the form of various other devices including, but not limited to a personal digital assistant (PDA) device, a mobile phone device, a television, etc.

Further, while not shown, the system 1000 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A circuit, comprising:
a first p-channel field-effect transistor (PFET) comprising a first source port, a first drain port, and a first gate port, wherein the first source port is coupled to a positive supply node, the first drain port is coupled to an intermediate output node, and the first gate port is coupled to a feedback node;
a first n-channel field-effect transistor (NFET) comprising a second source port, a second drain port, and a second gate port, wherein the second source port is coupled to an input node, the second drain port is coupled to the intermediate output node, and the second gate port is coupled to the feedback node;
a feedback resistive element coupled between the feedback node and the intermediate output node;
a feedback capacitive element coupled between the feedback node and an alternating current (AC) ground node; and
a termination resistive element coupled between the input node and the negative supply rail.

2. The circuit of claim 1, further comprising a first supply resistive element coupled between a positive supply rail and the positive supply node.

3. The circuit of claim 2, wherein the first supply resistive element is configured to provide one of at least two different resistance values in response to a digital control signal.

4. The circuit of claim 2, further comprising:
a second PFET comprising a third source port, a third drain port, and a third gate port, wherein the third source port is coupled to the positive supply node, the third drain port is coupled to the intermediate output node, and the third gate port is coupled to a bias node; and
a second NFET comprising a fourth source port, a fourth drain port, and a fourth gate port, wherein the fourth source port is coupled to the input node, the fourth drain port is coupled to the intermediate output node, and the fourth gate port is coupled to the bias node.

5. The circuit of claim 4, further comprising:
a second supply resistive element coupled between the positive supply rail and an intermediate positive node;
a third supply resistive element coupled between the negative supply rail and an intermediate negative node;
a third PFET comprising a fifth source port, a fifth drain port, and a fifth gate port, wherein the fifth source port is coupled to the intermediate positive node, the fifth drain port is coupled to the bias node, and the fifth gate port is coupled to the bias node; and
a third NFET comprising a sixth source port, a sixth drain port, and a sixth gate port, wherein the sixth source port is coupled to the intermediate negative node, the sixth drain port is coupled to the bias node, and the sixth gate port is coupled to the bias node.

6. The circuit of claim 5, wherein the second supply resistive element is configured to provide one of at least two different resistance values in response to a digital control signal.

7. The circuit of claim 5, wherein the third supply resistive element is configured to provide one of at least two different resistance values in response to a digital control signal.

8. The circuit of claim 5, wherein at least one of the first PFET, the second PFET, the third PFET, the first NFET, the second NFET, and the third NFET is configured to provide one of at least two different effective channel length to width ratios in response to a digital control signal.

9. The circuit of claim 2, further comprising:
a second supply resistive element coupled between the positive supply rail and an intermediate positive node;
a third supply resistive element coupled between the negative supply rail and an intermediate negative node;
a second PFET comprising a third source port, a third drain port, and a third gate port, wherein the third source port is coupled to the intermediate positive node, the third drain port is coupled to an unbuffered output node, and the third gate port is coupled to the intermediate output node;
a second NFET comprising a fourth source port, a fourth drain port, and a fourth gate port, wherein the fourth source port is coupled to the intermediate negative node, the fourth drain port is coupled to the unbuffered output node, and the fourth gate port is coupled to the intermediate output node; and
a buffer circuit comprising a buffer input port and a buffer output port, wherein the buffer input port is coupled to the unbuffered output node and the buffer output port is coupled to a buffered output node.

10. The circuit of claim 9, wherein at least one of the second supply resistive element and the third supply resistive element is configured to provide one of at least two different resistance values in response to a digital control signal.

11. The circuit of claim 1, wherein the termination resistive element is configured to provide one of at least two different resistance values in response to a digital control signal.

12. The circuit of claim 11, wherein the input node is coupled to an interconnect configured to have a characteristic impedance, and wherein the termination resistive element is configured by the digital control signal to provide a resistance value matching the characteristic impedance.

13. The circuit of claim 1, wherein the input node is coupled to an input/output bonding pad fabricated within the integrated circuit.

14. The circuit of claim 13, wherein the input/output bonding pad is coupled to an interconnect fabricated within a multi-chip module.

15. The circuit of claim 1, wherein the AC ground node is one of the positive supply rail and the negative supply rail.

16. The circuit of claim 1, wherein the positive supply node is a positive supply rail.

17. The circuit of claim 1, wherein the feedback capacitive element is configured to provide one of at least two different capacitance values in response to a digital control signal.

18. The circuit of claim 1, wherein the feedback resistive element is configured to provide one of at least two different resistance values in response to a digital control signal.

19. The circuit of claim 1, wherein the feedback capacitive element is configured to provide one of at least two different capacitance values in response to a digital resistance control signal, and the feedback resistive element is configured to provide one of at least two different resistance values in response to a digital capacitance control signal, and wherein a center peak frequency is determined by the digital resistance control signal in conjunction with the digital capacitance control signal.

20. The circuit of claim 1, further comprising:
a second PFET comprising a third source port, a third drain port, and a third gate port, wherein the third source port is coupled to the positive supply node, the third drain port is coupled to the intermediate output node, and the third gate port is coupled to a bias node; and
a second NFET comprising a fourth source port, a fourth drain port, and a fourth gate port, wherein the fourth source port is coupled to the negative supply rail, the fourth drain port is coupled to the intermediate output node, and the fourth gate port is coupled to the bias node.

21. A circuit, comprising:
a first p-channel field-effect transistor (PFET) comprising a first source port, a first drain port, and a first gate port, wherein the first source port is coupled to an input node, the first drain port is coupled to an intermediate output node, and the first gate port is coupled to a feedback node;
a first n-channel field-effect transistor (NFET) comprising a second source port, a second drain port, and a second gate port, wherein the second source port is coupled to a negative supply node, the second drain port is coupled to the intermediate output node, and the second gate port is coupled to the feedback node;
a feedback resistive element coupled between the feedback node and the intermediate output node;
a feedback capacitive element coupled between the feedback node and a an alternating current (AC) ground node; and
a termination resistive element coupled between the input node and a positive supply rail.

22. The circuit of claim 21, further comprising a first supply resistive element coupled between the negative supply node and a negative supply rail.

23. The circuit of claim 21, wherein the AC ground node is one of the positive supply rail and the negative supply rail.

* * * * *